(12) United States Patent
Yonekawa et al.

(10) Patent No.: US 7,319,507 B2
(45) Date of Patent: Jan. 15, 2008

(54) APPARATUS AND METHOD FOR REMOVING CONTAMINANT ON ORIGINAL, METHOD OF MANUFACTURING DEVICE, AND ORIGINAL

(75) Inventors: Masami Yonekawa, Utsunomiya (JP); Shinichi Hara, Yokohama (JP); Ryo Edo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 11/250,072

(22) Filed: Oct. 12, 2005

(65) Prior Publication Data

US 2006/0082743 A1    Apr. 20, 2006

(30) Foreign Application Priority Data

Oct. 14, 2004   (JP)   ............................. 2004-299790

(51) Int. Cl.
*G03B 27/42*   (2006.01)
*G03B 27/52*   (2006.01)

(52) U.S. Cl. .......................................... 355/53; 355/30
(58) Field of Classification Search ................... 355/30, 355/53, 67, 72–76; 356/237.2, 237; 250/492.2; 430/5, 20, 30
See application file for complete search history.

(56) References Cited

U.S. PATENT DOCUMENTS

| 4,980,536 | A |  | 12/1990 | Asch |  |
|---|---|---|---|---|---|
| 6,038,015 | A | * | 3/2000 | Kawata | ........................ 355/67 |
| 6,385,290 | B1 |  | 5/2002 | Kondo |  |
| 6,538,722 | B2 | * | 3/2003 | Matsumoto et al. | ........... 355/53 |
| 6,781,673 | B2 | * | 8/2004 | Moors et al. | .................. 355/76 |
| 6,980,278 | B2 | * | 12/2005 | Aoyama et al. | ............... 355/53 |
| 2005/0069433 | A1 | * | 3/2005 | Hayashi | .................... 417/423.4 |

FOREIGN PATENT DOCUMENTS

| JP |  | 64-012526 A | 1/1989 |
| JP |  | 2000-088999 A | 3/2000 |

* cited by examiner

*Primary Examiner*—Henry Hung Nguyen
(74) *Attorney, Agent, or Firm*—Canon U.S.A. Inc. IP Division

(57) ABSTRACT

At least one exemplary embodiment is directed to an apparatus which includes an original stage, to hold an original, which moves in a scan direction, an illumination optical system configured to illuminate the original held by the original stage with exposure light, a substrate stage configured to hold a substrate and to move in a scan direction, a projection optical system configured to project a pattern of the original onto the substrate with the exposure light, and an irradiation unit configured to irradiate the original held by the original stage. Irradiation by the irradiation unit and movement of the original stage in the scan direction are carried out substantially in parallel with each other so as to remove a contaminant on the original.

14 Claims, 11 Drawing Sheets

APPARATUS AND METHOD FOR REMOVING CONTAMINANT ON ORIGINAL, METHOD OF MANUFACTURING DEVICE, AND ORIGINAL

BACKGROUND OF THE INVENTION

1. Field of the Invention

The present invention relates to a technique to expose a substrate to light through an original. More specifically, though not exclusively, the present invention relates to a technique to remove a contaminant on the original, and an original and a method of manufacturing a device concerning removal of the contaminant.

2. Description of the Related Art

Concerning the manufacture of semiconductor devices such as a DRAM (Dynamic Random Access Memory) and an MPU (Micro Processing Unit), research and development are performed energetically in order to realize a device having a line width of less than 100 nm under a design rule. As an exposure apparatus used in this generation, an exposure apparatus using extreme ultraviolet (EUV) light is believed to be effective.

In general, a semiconductor exposure apparatus irradiates a reticle (also called a "mask") having a circuit pattern with illumination light. The illuminated circuit pattern is reduced to, for example, ¼ and projected onto a wafer with a projection optical system. The wafer is coated with photoresist (resist). Therefore, in the actual exposure, if particles adhere to the circuit-pattern surface of the reticle, images of the particles are printed at exactly the same position in each shot. Therefore, there are fatal problems of significant drops in the yield of manufacture of semiconductor devices and in the reliability of semiconductor devices themselves.

To solve these problems, in conventional exposure apparatuses having light sources (e.g., emitting a g-ray, an i-ray, a krypton fluoride (KrF) laser beam, or an argon fluoride (ArF) laser beam) a transparent protective coat called "pellicle" is disposed a few millimeters apart from the circuit-pattern surface, thereby protecting the circuit pattern from the adhesion of particles. The particles adhering to this pellicle is defocused from the object plane (the circuit-pattern surface). Normally, when the sizes of the particles are less than a predetermined size, the images of the particles are not printed onto the wafer.

However, in an EUV exposure apparatus, there is no pellicle that is transparent to EUV light. In order to satisfy the required transmittance, the thickness of the pellicle must be several tens of nanometers. If a pellicle has such a thickness, it is very difficult to ensure sufficient strength. A reticle is carried from atmospheric pressure to a vacuum environment, and from the vacuum environment to atmospheric pressure. In consideration of both the mechanical aspect concerning the pressure change and the thermal aspect concerning the temperature change due to absorption of EUV exposure light, it is very difficult to use a pellicle.

Therefore, in the EUV exposure apparatus, the reticle cannot be provided readily with a pellicle. When particles are generated in the exposure apparatus, there is a fear that the particles will adhere to the circuit-pattern surface of the reticle.

Manufacturing of devices of 35 nm under a design rule will be taken as an example. Assume that the reduction ratio of the projection optical system is 4:1 and particles having a diameter of 0.1 µm adhere to the circuit pattern of the reticle. In this case, the images of the particles on the wafer have a diameter of 25 nm, and therefore manufacture of the devices is impossible. Actually, the particle diameter to be controlled is still smaller. It is less than several tens of nanometers.

It is uncertain how the nanometer-sized particles are generated in the apparatus and how they move. Possible particles include particles generated due to the friction in robot hands and gate valves, and a small amount of debris coming from the light source side.

Since the exposure of the EUV exposure apparatus is carried out in a vacuum, a reticle is carried in and out through a load lock chamber. In the load lock chamber, there is also a fear that particles adhere to the reticle. When the load lock chamber is evacuated of air, particles in the chamber are unstuck by the stream of air and then adhere to the pattern surface of the reticle.

Since there are few gas molecules in a vacuum, fluid resistance does not act on the particles and only gravity acts on the particles. It is also reported that if the particles make approximately elastic collisions with the inner wall of the chamber, the particles bounce about in the chamber. Charged particles generated by friction adhere to components, even when the components are grounded to 0 V, because force based on "image of electric charge" effect acts between the particles and the components. Anyway, it is uncertain how the particles are generated and how they move in a vacuum. Therefore, it is very difficult to deal with the particles.

There are two approaches to the problem in which particles adhere to the circuit pattern surface of a reticle in the exposure chamber. That is to say, to reduce the occurrence of the particles adhering to the reticle and to remove the particles after they adhere to the reticle.

Concerning the latter approach, irradiation with a pulse laser has been proposed as a mechanism to effectively remove particles with the exposure chamber being in a vacuum environment. Irradiation of pulse light in the order of nanoseconds causes thermal expansion on the surfaces of particles and a substrate in a short period of time in the order of nanoseconds. When the force corresponding to the acceleration generated by this thermal expansion becomes larger than the adhesion force of the particles, the particles are removed from the substrate. An apparatus using this technique is discussed in Japanese Patent Publication No. 6-95510. The apparatus includes a laser device for irradiating a mask with a laser having a power density that can remove particles without damaging the surface of the mask, and a device for raising the mask from the exposure position so that laser irradiation can be carried out. Japanese Patent Laid-Open No. 2000-088999 discusses an exposure apparatus including a mechanism for irradiating an X-ray optical element (reticle) with a pulse laser light (KrF excimer laser). It is proposed to introduce an inert gas into the vacuum chamber and to irradiate the reticle with the laser light.

However, the above known techniques have the following difficulties.

In the case of Japanese Patent Publication No. 6-95510, when the particles adhering to a mask are removed by irradiation of a pulse laser, the mask is moved to a position different from the exposure position. Since the exposure is not carried out during the mask cleaning, the throughput is extremely reduced. In addition, there is a fear that when the mask moves to the different position, particles are generated due to friction and after the cleaning is completed, the particles adhere to the mask.

In the case of Japanese Patent Laid-Open No. 2000-088999, when the reticle is cleaned with a pulse laser, an inert gas is introduced into the vacuum chamber. Fluid resistance of the gas acts on the particles released from the surface of the reticle by irradiation of the pulse laser. The particles are trapped in the gas. Therefore, supplying the gas into the chamber at a constant flow rate and then recovering the gas makes it possible to remove the particles from the chamber together with the gas. However, the inside of the vacuum chamber of an EUV exposure apparatus is in a high vacuum environment (10E-3 to 10E-5 Pa). If the gas for removing the particles is introduced into the chamber, it takes at least several hours to return the chamber to the high vacuum environment after the cleaning is completed, although the actual time depends on the volume of the chamber and the evacuation rate of the vacuum pump. Therefore, exposure cannot be carried out during this time, and the effective operating rate of the apparatus is extremely reduced.

The above known techniques also have common difficulties. If particles adhere to a reticle and exposure is carried out before the particles are removed, all shots after the adhesion are defective, and the yield of manufacture of devices can be extremely reduced. As described above, it is uncertain how the particles are generated in the vacuum chamber and how they move. It is supposed that adhesion of the particles to the mask is a completely random unreproducible phenomenon. The above known techniques are provided only with a cleaning device using a pulse laser. Therefore, the above known techniques cannot be used effectively on the manufacturing floor. If the above known techniques are provided with a method for always monitoring the adhesion of particles to the reticle during exposure, it is possible to start the cleaning operation as soon as the adhesion of particles is detected. However, it is very difficult to detect particles that adhere to the surface of a reticle moving at high speed and have a diameter of several tens of nanometers, in real time with the present technology.

As described above, although the above known techniques can remove particles adhering to the reticle (mask), the throughput or the operating rate of the apparatus is extremely reduced. In addition, the reduction in the yield of manufacturing devices due to the adhesion of particles to the reticle is not sufficiently improved.

SUMMARY OF THE INVENTION

The present invention is made in consideration of the above known techniques. The present invention provides a technique for removing a contaminant on an original, the technique being advantageous in terms of the throughput and the contaminant removal performance.

In a first aspect of the present invention, an apparatus includes an original stage holding an original and moving in a scan direction, an illumination optical system configured to illuminate the original held by the original stage with exposure light, a substrate stage holding a substrate and moving in a scan direction, a projection optical system configured to project a pattern on the original onto the substrate with the exposure light, and an irradiation unit configured to irradiate the original held by the original stage with light different from the exposure light. Irradiation by the irradiation unit and movement of the original stage are carried out in parallel with each other so as to remove a contaminant on the original.

In a second aspect of the present invention, a method of manufacturing a device includes the steps of projecting a pattern of an original onto a substrate using an apparatus as defined in the first aspect, developing the substrate onto which the pattern has been projected, and processing the developed substrate to manufacture the device.

In a third aspect of the present invention, a method is applied to an exposure apparatus including an original stage holding an original and moving in a scan direction, an illumination optical system configured to illuminate the original held by the original stage with exposure light, a substrate stage holding a substrate and moving in a scan direction, and a projection optical system configured to project a pattern on the original onto the substrate with the exposure light. The method is for removing a contaminant on the original and includes the steps of irradiating the original held by the original stage with light different from the exposure light, and moving the original stage in a scan direction. The irradiating step and the moving step are carried out in parallel with each other so as to remove a contaminant on the original.

In a fourth aspect of the present invention, an original for printing a pattern on a substrate using exposure light includes a multiple layer reflecting the exposure light, an absorbing layer absorbing the exposure light, and a thermal expansion layer in which an absorption coefficient for light for removing a contaminant on the original is larger than an absorption coefficient for the exposure light. The absorbing layer is disposed above the multiple layer. The thermal expansion layer is disposed between the multiple layer and the absorbing layer.

Other advantages besides those discussed above shall be apparent to those skilled in the art from the description of exemplary embodiments of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate exemplary embodiments of the invention.

DESCRIPTION OF THE EMBODIMENTS

Figure 1:
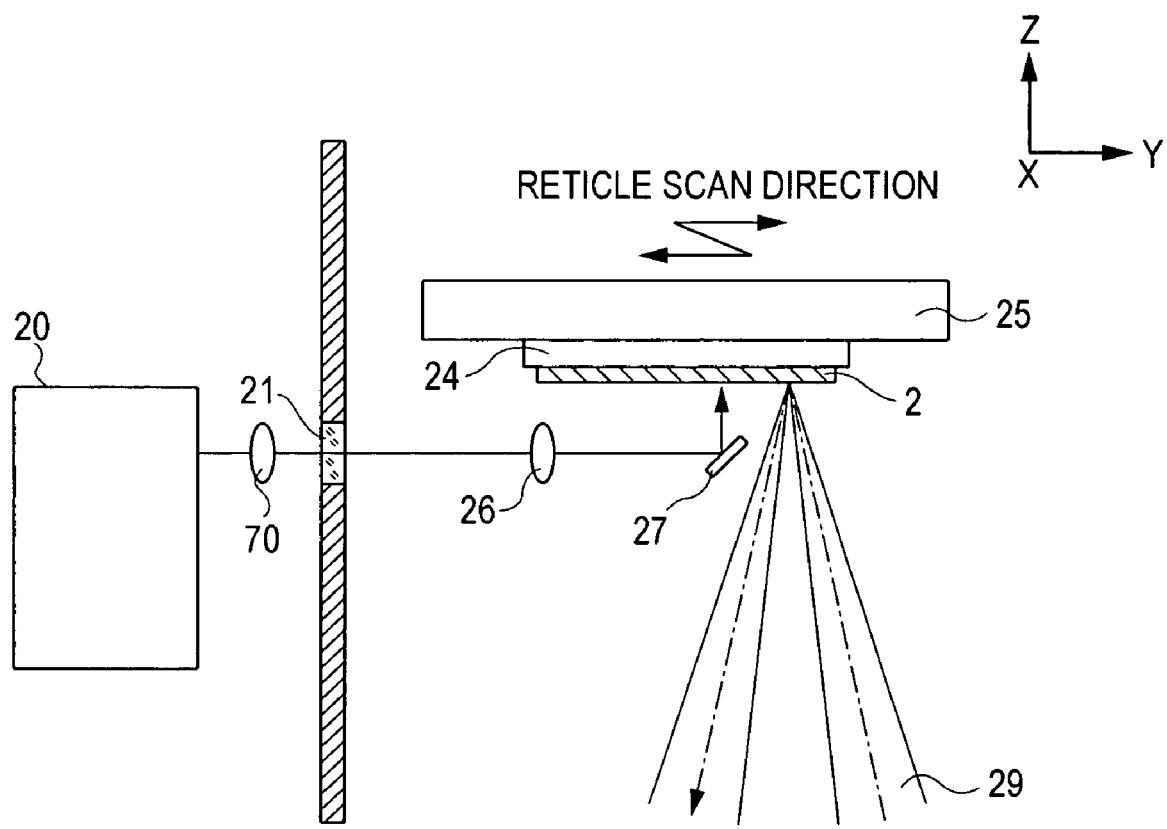
FIG. 1 illustrates a front view of a device for removing particles with a pulse laser beam in accordance with a first exemplary embodiment.

The following description of exemplary embodiment(s) is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate. For example reticles are discussed and any material that can be used to form reticles should fall within the scope of exemplary embodiments (e.g., glass, Si), as well as methods of forming such reticles (e.g., electron beam writing).

Additionally exemplary embodiments are not limited to UV or EUV light systems, for example the system can be designed for use with higher wavelength systems. Notice that similar reference numerals and letters refer to similar items in the following figures, and thus once an item is defined in one figure, it may not be discussed for following figures.

Exemplary embodiments of the present invention will now be described in detail with reference to the drawings.

First Exemplary Embodiment

Figure 3:
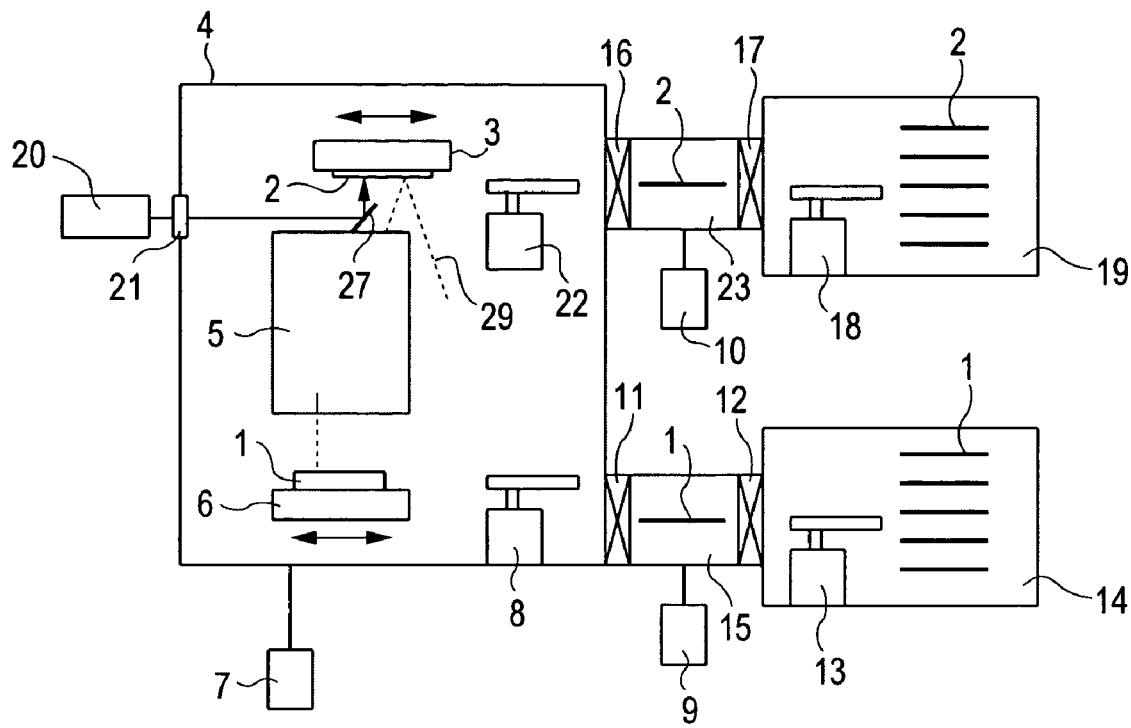
FIG. 3 illustrates an exposure apparatus system applying at least one exemplary embodiment.

Before describing a first exemplary embodiment in detail, the structure of an EUV exposure apparatus to which exemplary embodiments can be applied will be outlined with reference to FIG. 3.

Reference numeral 1 denotes a wafer. Reference numeral 2 denotes a reflective reticle with an electronic circuit pattern. Reference numeral 3 denotes a reticle stage. The reticle stage 3 holds the reflective reticle 2, and moves it in the scan direction roughly and finely. Reference numeral 5 denotes an optical system. Light 29 (e.g., EUV) is reflected by the reticle 2 and is then projected by the optical system 5 onto the wafer 1. Reference numeral 6 denotes a wafer stage. The wafer stage 6 holds the wafer 1 and moves in six axis directions roughly and finely. The x-y position of the wafer stage 6 can be monitored by a laser interferometer (not shown). Normally, the reticle stage 3 and the wafer stage 6 are controlled so that their motions synchronize with each other. When the reduction ratio of the projection optical system is $1/\beta$, the velocity (Vr) of the reticle stage 3 and the velocity (Vw) of the wafer stage 6 are controlled so as to satisfy the relationship $Vr/Vw=\beta$. Since exposure is carried out in a vacuum environment, the above-described units are contained in an exposure apparatus chamber 4. Reference numeral 7 denotes a vacuum pump for evacuating air and other gases from the exposure chamber 4.

Reference numeral 15 denotes a wafer load lock chamber. Reference numeral 8 denotes a robot hand carrying the wafer 1 between the wafer load lock chamber 15 and the wafer stage 6. Reference numeral 9 denotes a vacuum pump for evacuating air from the wafer load lock chamber 15. The vacuum pump 9 is used together with a source for supplying gas (e.g., dried $N_2$ or dried air) to bring the wafer load lock chamber 15 back to atmospheric pressure. Reference numeral 11 denotes an apparatus-side gate valve, which separates the apparatus chamber 4 from the wafer load lock chamber 15. Reference numeral 14 denotes a wafer storage. The wafers 1 are temporarily stored in the wafer storage 14 under atmospheric pressure. Reference numeral 12 denotes an storage-side gate valve, which separates the wafer load lock chamber 15 from the wafer storage 14. Reference numeral 13 denotes a robot hand carrying the wafer 1 between the wafer load lock chamber 15 and the wafer storage 14.

Reference numeral 23 denotes a reticle load lock chamber. Reference numeral 22 denotes a robot hand carrying the reticle 2 between the reticle load lock chamber 23 and the reticle stage 3. Reference numeral 10 denotes a vacuum pump for evacuating air from the reticle load lock chamber 23. The vacuum pump 10 is used together with a source for supplying gas (e.g., dried $N_2$ or dried air) to bring the reticle load lock chamber 23 back to atmospheric pressure. Reference numeral 16 denotes an apparatus-side gate valve, which separates the apparatus chamber 4 from the reticle load lock chamber 23. Reference numeral 19 denotes a reticle storage. The reticles 2 are temporarily stored in the reticle storage 19 under atmospheric pressure. Reference numeral 17 denotes a storage-side gate valve, which separates the reticle load lock chamber 23 from the reticle storage 19. Reference numeral 18 denotes a robot hand carrying the reticle 2 between the reticle load lock chamber 23 and the reticle storage 19.

Reference numeral 20 denotes a pulse laser light source used in the exemplary embodiments. A pulse light beam emitted from the light source 20 is introduced into the vacuum chamber 4 through a window 21. The pulse light beam is shaped by an optical system (not shown). The beam is reflected upward by an optical element (e.g., a mirror) 27, and the circuit pattern of the reticle 2 is irradiated with the beam. These are the components of at least one EUV exposure apparatus in accordance with at least one exemplary embodiment.

Next, a first exemplary embodiment will be described with reference to FIG. 1. FIG. 1 illustrates a front view of a system in accordance with the first exemplary embodiment. Reference numeral 2 denotes a reticle. The reticle 2 has a circuit pattern on a surface of the reticle (e.g., on the lower surface). Light 29 (e.g., EUV) emitted from an illumination optical system (not shown) is incident on the reticle 2 from below. The light 29 is reflected by the circuit pattern and is incident on a projection optical system (not shown). Reference numeral 24 denotes a chuck holder for sucking and holding the reticle 2. The chuck holder 24 is attached to a reticle stage body 25 and is finely moved relative to the reticle stage body 25 by a mechanism (not shown). During exposure, the reticle stage repeats any acceleration, constant speed motion, and deceleration in the Y-axis direction so that the reticle is scanned.

Reference numeral 20 denotes a pulse laser light source configured to aid in the removal of particles (also called contaminants). A KrF laser light source (248 nm) and an yttrium aluminum garnet (YAG) laser light source (1064 nm) are mainly used as the light source 20, although other sources of differing wavelengths can be used within the scope of exemplary embodiments. Reference numeral 70 denotes a shaping optical system for changing the emitted beam into parallel light. Reference numeral 21 denotes a window provided in the wall of the exposure chamber 4 for introducing the pulse laser beam. The window 21 is formed of an optical material that has low absorption to the incident wavelength used, for example, quartz glass. Reference numeral 26 denotes an optical system for collecting the incident pulse beam into a shape appropriate for removing particles. The collected beam is reflected upward by an optical element (e.g., a mirror) 27, and the pattern surface of the reticle 2 is irradiated with the beam. In the present exemplary embodiment, the cross section of the pulse laser beam is elongated in a direction perpendicular to the scan direction (e.g., in the X direction in FIG. 1). Therefore, the beam is sheet-shaped.

Figure 2:
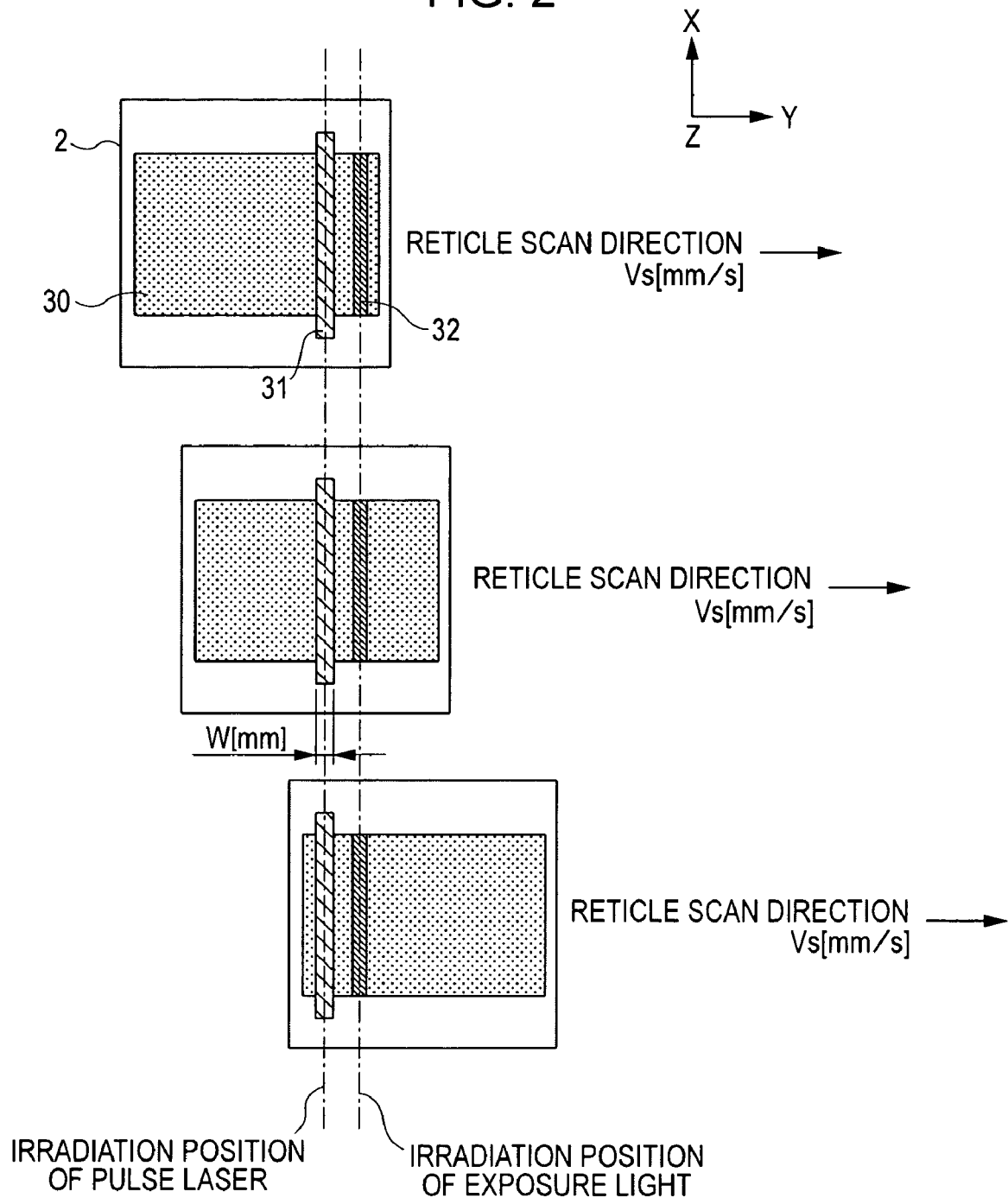
FIG. 2 illustrates relative positional relationships among the irradiation positions of the pulse laser beam, the irradiation position of the EUV exposure light, and a particle removal area in accordance with the first exemplary embodiment.

FIG. 2 illustrates a relative positional relationship among the reticle 2, the irradiation position of the pulse laser for removing particles, and the irradiation position of the exposure light (e.g., EUV). Reference numeral 30 denotes a particle removal area on the reticle 2. Reference numeral 31 denotes a cross section of the pulse laser light. The cross section is elongated by the optical system in a direction (X direction) perpendicular to the scan direction (Y direction). Therefore, the pulse laser beam is sheet-shaped. The cross section of the pulse laser beam has a length sufficient to cover the particle removal area 30. Reference numeral 32 denotes a cross section of the exposure light. In FIG. 2, the cross section is a rectangle. However, the cross section may be a circular arc, depending on characteristics of the illumination optical system or any other shape that is desirable. As described above, the cross section of the pulse laser beam for removing particles is elongated in a direction (X direction) perpendicular to the scan direction. The area irradiated with the pulse laser beam and the area irradiated with the EUV exposure light can be adjacent and parallel to each other. Since the reticle stage reciprocates during exposure, the particle removal area 30 can be entirely irradiated with the pulse laser beam.

Next, a relationship among the velocity of the stage (Vs), the pulse frequency of the pulse laser (F), the number of irradiation pulses (N), and the thickness of the sheet beam (W) will be described. The relationship is useful for obtaining an effective removal rate when the reticle is irradiated with the pulse laser light to remove particles.

Figure 4:
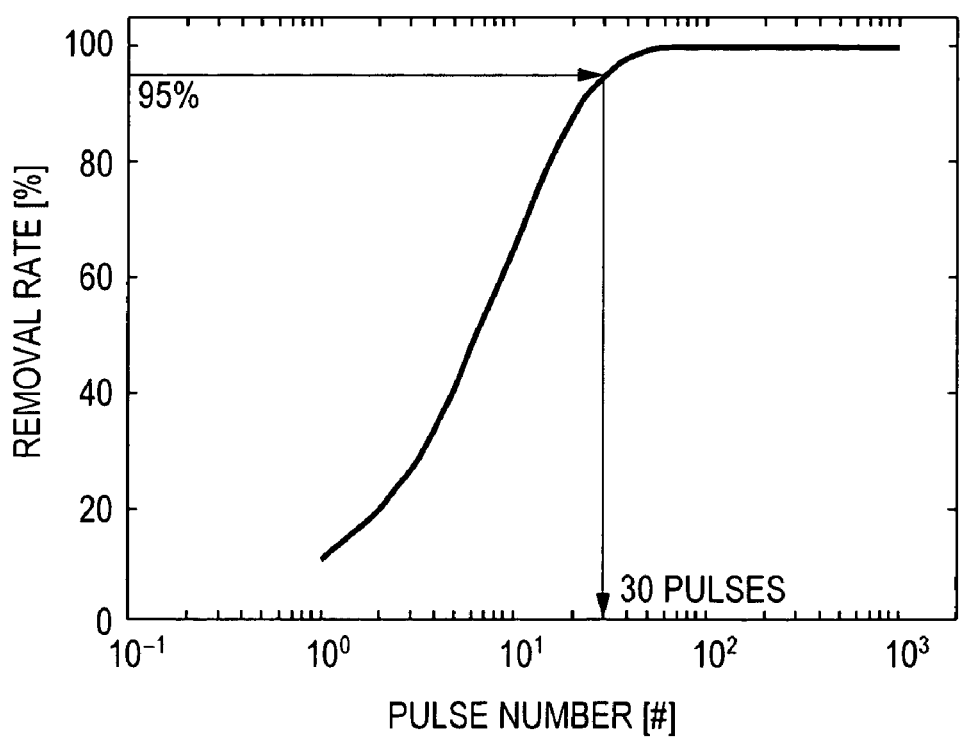
FIG. 4 illustrates the dependence of the removal rate of the first exemplary embodiment on the number of irradiation pulses.

According to the experiment carried out by the inventor concerning the pulse laser irradiation, increasing the number of pulses with which a reticle is irradiated improved the removal rate of particles adhering to the reticle. FIG. 4 outlines this. For example, when particles with a diameter of 0.1 μm were irradiated with one pulse under a certain laser-irradiation condition, the removal rate was no more than 10 percent. However, increasing the number of pulses gradually improved the removal rate. In this example, irradiation with approximately 80 pulses achieved a removal rate of almost 100 percent. In general, the adhesion forces between the particles and the reticle include intermolecular force (van der Waals force), liquid bridge force, and electrostatic force. In a normal environment, the main adhesion force is the intermolecular force (van der Waals force). The experimental result illustrates that irradiating with a large number of pulses gradually diminishes the adhesion force and consequently the particles are removed. Note that exemplary embodiments are not limited to a particular number of pulses. It is reported that the damage of the surface due to irradiation by the laser pulse light depends not the integral value of the pulse energy but the energy density per pulse. The same result was obtained from the experiment carried out by the inventors.

One of the biggest challenges in irradiating a reticle multilayer with a pulse laser is the possibility of surface damage. The above experimental results illustrate that in the case of irradiation using a low energy density that does not damage the reticle surface, the removal rate per pulse is low, however, a large number of pulses can achieve a sufficient removal rate. The number of irradiation pulses N necessary for application to an actual apparatus depends on the material of particles and the pulse energy density. Therefore, obtaining the number N from experiments in advance can facilitate more efficient particle removal. For example, in the example illustrated in FIG. 4, irradiation with 30 pulses or more results in an about 95% removal rate.

In FIG. 2, the reticle moves at a constant velocity Vs [mm/s], the thickness of the pulse laser beam is W [mm], the pulse frequency of the pulse laser is F [Hz], and the number of pulses necessary for removal is N [#]. The time required for the reticle to move by the thickness of the beam W ($\Delta Ts$) is obtained from the following formula:

$$\Delta Ts = W/Vs \qquad (1)$$

When the moving reticle needs to be irradiated with at least N pulses in $\Delta Ts$, the pulse interval $\Delta Tp$ is obtained from the following formula:

$$\Delta Tp = \Delta Ts/N = W/(Vs*N) \qquad (2)$$

On the other hand, the pulse interval of the pulse laser light source ($\Delta \tau$) is obtained from the following formula:

$$\Delta \tau = 1/F \qquad (3)$$

If $\Delta Tp$ is smaller than $\Delta \tau$, the system does not work or a higher laser pulse frequency is needed. Therefore, $$W/(Vs*N) > 1/F \qquad (4)$$

$$\therefore (Vs*N)/W < F \qquad (5)$$

That is to say, for a given laser pulse frequency F, the simple relational expression (5) can be satisfied to obtain a reasonable removal rate. For example, when Vs is 100 [mm/s], F is 300 [Hz], and N is 30 [#], the thickness of the sheet beam (W) needs to be at least 10 [mm] according to the formula (5).

Figure 5:
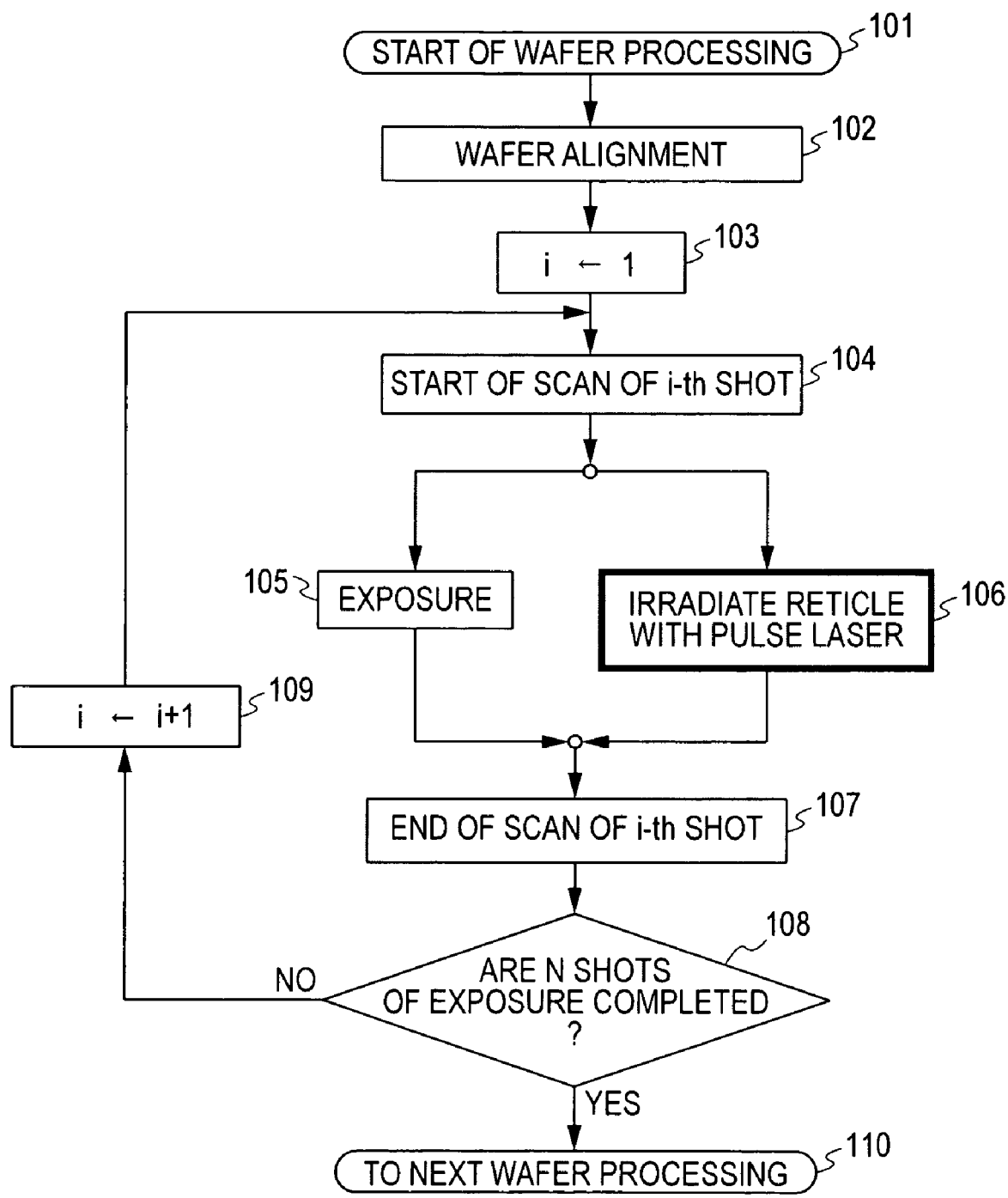
FIG. 5 illustrates a flow chart showing a process in accordance with the first exemplary embodiment. In the process, irradiation of the pulse laser beam is carried out during exposure.

Next, the timing of irradiating the reticle with the pulse laser will be described with reference to a flow chart of FIG. 5. In the example of FIG. 5, the reticle is irradiated with the pulse laser contemporaneously with the exposure. First, in order to expose a desired layer, the reticle is already loaded on the exposure apparatus and the reticle alignment is completed. A wafer is loaded on the stage and wafer processing is started (101). Before exposure, the wafer is aligned (102). Argument i, which represents the number of shots, is set to one (103). The scan operation of the first shot (i.e., ith shot, where for the first loop i=1) is started (104). The reticle and the wafer are moved in a speed ratio of, for example, 4:1 so that they are scanned in a synchronized manner. Note that the ratio 4:1 is a non-limiting example and other exemplary embodiments can have different ratios. When the position error of each stage is within a predetermined tolerance, exposure is carried out (105). In parallel with the exposure, a place adjacent to the exposed place is irradiated with a pulse laser beam for removing particles (106). When the exposure and the laser irradiation are completed, the exposure operation for the first shot is completed (107). At this moment, only the exposure for the first shot is completed. Therefore, determination in Step 108 is "No." The number of shots (i) is increased by one (109). Next, the exposure operation for the second shot is started (104). The above operations are repeated until a desired number of shots (N shots) of exposure are carried out. In this way, processing of one wafer is completed, and then the next wafer processing is started (110). In this example, irradiating the reticle with the pulse laser is carried out in parallel with exposure. Therefore, the reticle can be kept clean without reducing the throughput.

Figure 6:
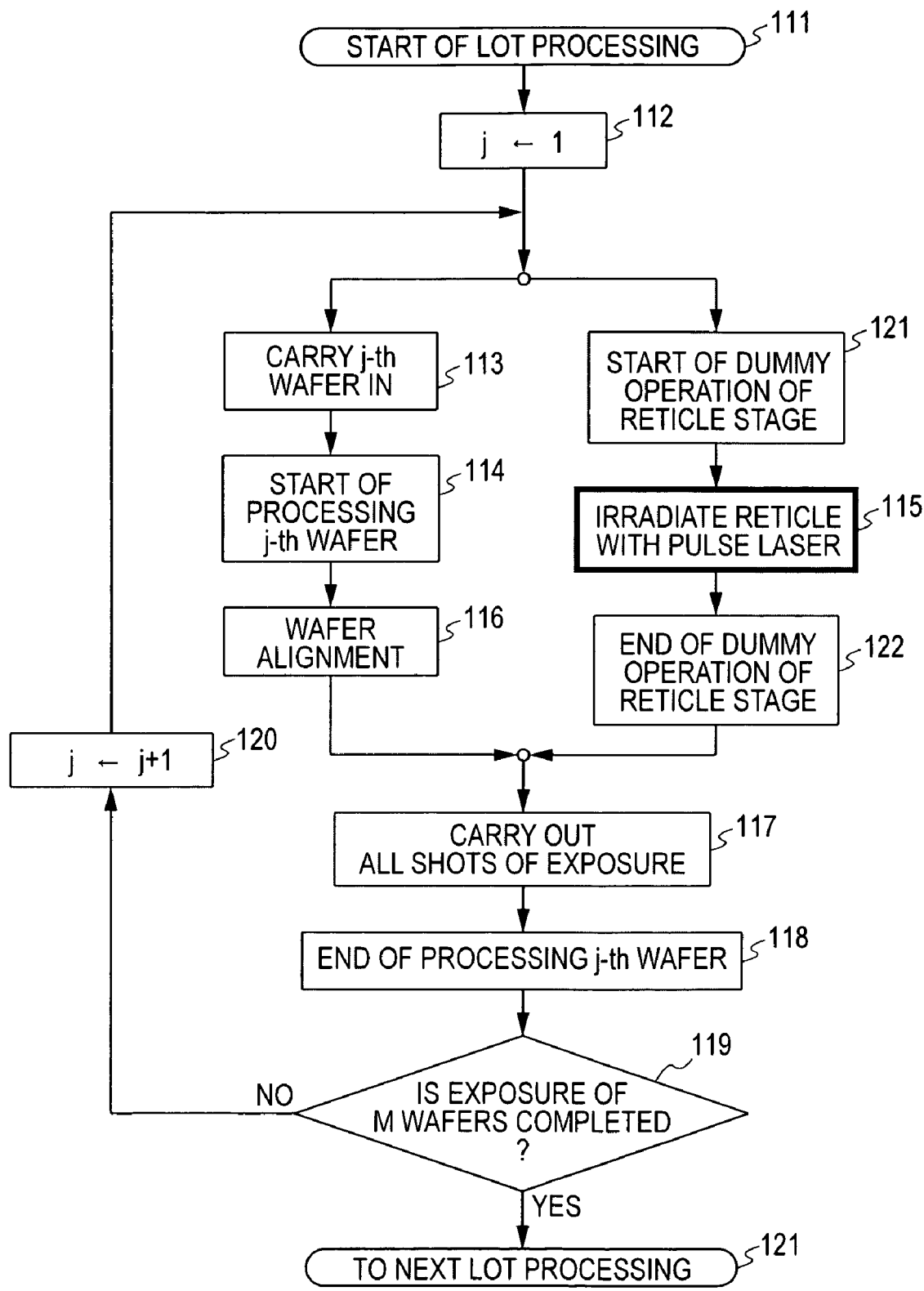
FIG. 6 illustrates a flow chart showing another process according to the first exemplary embodiment. In the process, irradiation of the pulse laser beam is carried out during the wafer alignment.

In the example of FIG. 6, the irradiation of the pulse laser is carried out when a wafer is replaced or when a wafer is aligned. First, in order to expose a desired layer, the reticle is already loaded on the exposure apparatus, and the reticle alignment is completed. Lot processing is started (111). Argument j, which represents the number of wafers, is set to one (112). The first wafer is loaded on the wafer stage (113). Processing the first wafer is started (114). Before exposure, the wafer is aligned (116). On the other hand, in parallel with Steps 113, 114, and 116, the reticle stage carries out a dummy operation for pulse laser irradiation (121). Next, the reticle is irradiated with the pulse laser light for removing particles (115). When the irradiation is completed, the dummy operation of the stage is also completed. This series of steps 121, 115, and 122 (pulse laser irradiation operation) has only to be completed while the wafer processing steps 113, 114, and 116 are carried out. Therefore, the number of the dummy operation of the reticle stage and the number of the laser irradiation are not limited to one. When Steps 116 and 122 are completed, the exposure of the first wafer is started (117). When all shots of the exposure are completed, processing of the first wafer is completed (118). At this moment, only the exposure for one wafer is completed. Therefore, determination in Step 119 is "No." The number of wafers (argument j) is increased by one (120). In order to start processing the next wafer, the second wafer is loaded on the stage (113). Processing of the second wafer is started (114). As described above, the series of steps 121, 115, and 122 (pulse laser irradiation operation) is carried out in parallel with the steps 113, 114, and 116. The above operations are repeated until the exposure of M wafers is completed (119). When the exposure of M wafers is completed, the next lot processing is started (121). In this example, irradiating the reticle with the pulse laser is carried out in parallel with the replacement of the wafer and the wafer alignment operation. Therefore, the reticle can be kept clean without reducing the throughput.

Alternatively, the pulse laser irradiation can be carried out when the reticle is carried in the apparatus from the reticle load lock chamber. Alternatively, the pulse laser irradiation can be carried out in a timing that combines the above-described examples. When the number of particles is low, and that number approaches a chosen value of the number of particles acceptable for the desired cleanliness (e.g. number of particles/cm^2), the number of irradiation operations can be decreased.

Second Exemplary Embodiment

Next, a second exemplary embodiment will be described. In the first exemplary embodiment, as illustrated in FIG. 2, the irradiation position of the pulse laser (31) is located on the −Y side of the irradiation position of the exposure light (32). When the reticle 2 moves in the +Y direction, the reticle 2 is irradiated with the pulse laser light just before the irradiation of exposure light. If particles adhere to the reticle 2, they are removed just before the exposure. Therefore, the surface to be irradiated with the exposure light is always clean. However, when the reticle 2 goes back in the −Y direction, the reticle 2 is irradiated with the pulse laser light just after the irradiation of exposure light. Therefore, particles that newly adhere to the reticle 2 cannot be removed before the exposure.

Figure 8:
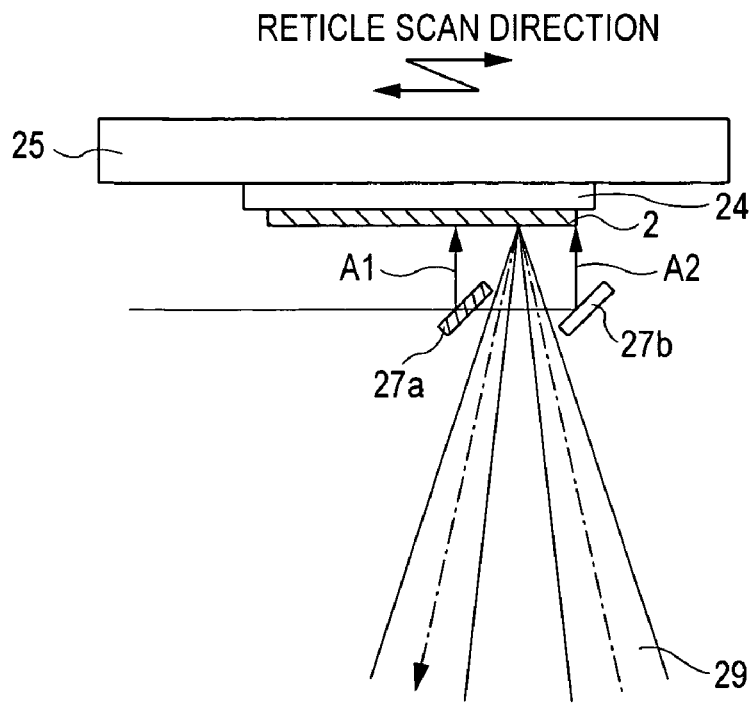
FIG. 8 illustrates the irradiation positions of the pulse laser beam in accordance with a second exemplary embodiment.

As a remedy for the problem, in the second exemplary embodiment, two places are irradiated with the pulse laser as shown in FIG. 8. A place between the two places is irradiated with the exposure light 29. In particular, half of the pulse laser light can be reflected by an optical element (e.g., half mirror) 27a, and the other half passes through the optical element 27a and is then reflected by another optical element (e.g., a mirror) 27b. In this way, the pulse laser light is divided into two beams (A1 and A2). Such a configuration makes it possible to irradiate the surface of the reticle with a pulse beam just before the exposure, regardless of the direction in which the reticle moves. Therefore, if particles adhere to the surface of the reticle while the reticle stage is moving, the particles can be immediately removed. Thus, the reticle is kept clean.

Figure 9:
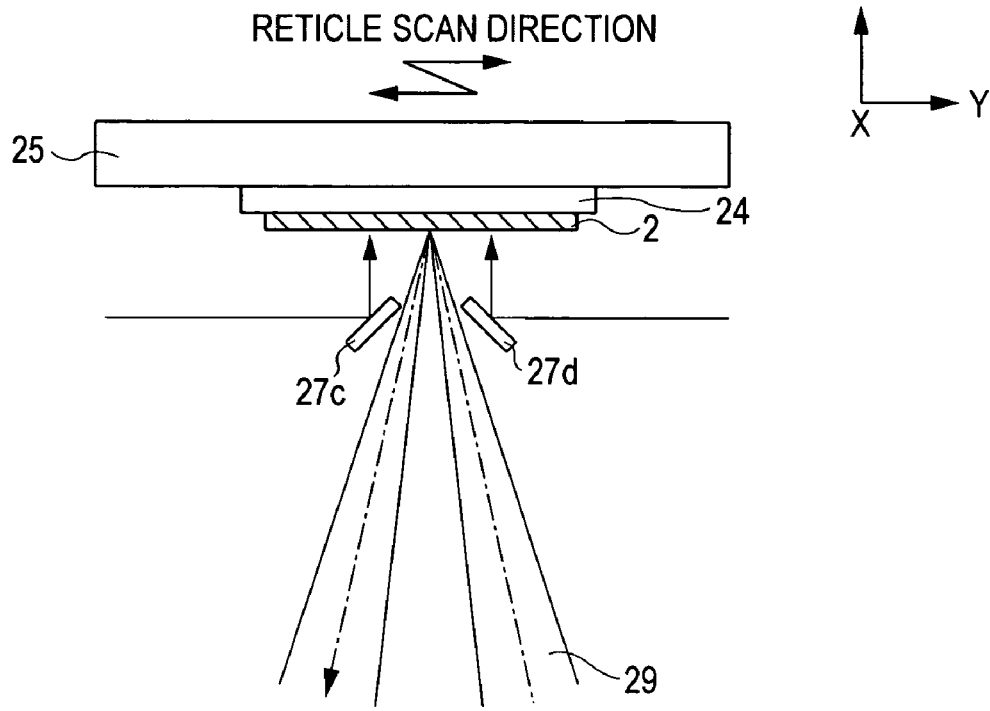
FIG. 9 illustrates the irradiation positions of the pulse laser beam in accordance with the second exemplary embodiment.

Alternatively, as shown in FIG. 9, two pulse laser beams may be emitted at the same time from the ±Y directions. The two beams can be reflected by optical elements (e.g., mirrors) 27c and 27d toward the reticle 2. Any configuration will do as long as it breaks the one beam into at least two beams or provides two or more beams (e.g., from different sources).

Figure 11A:
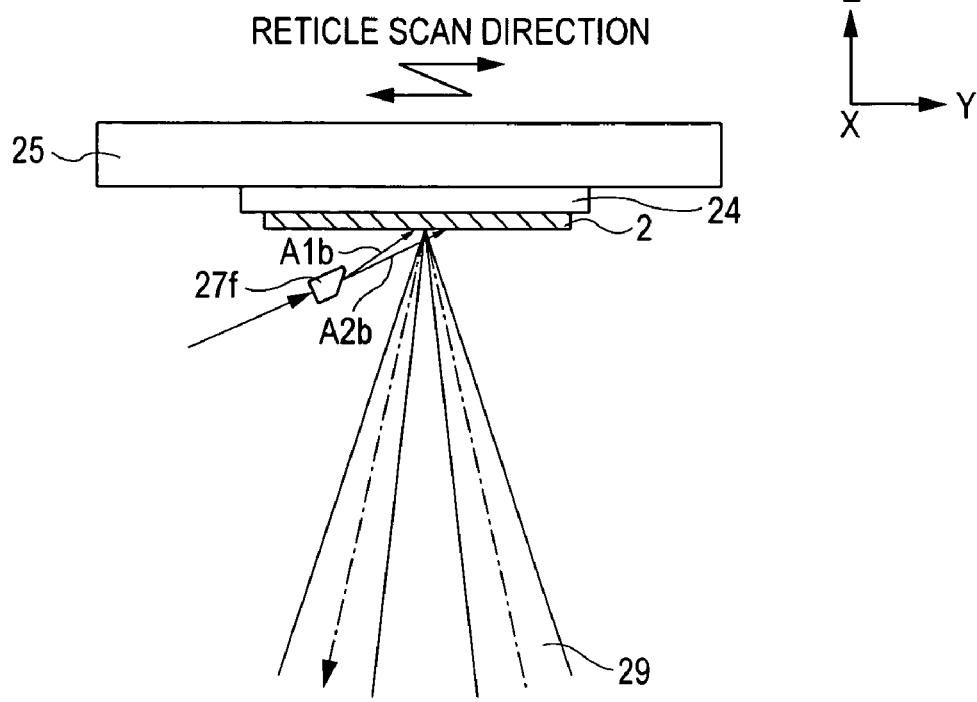
FIGS. 11A and 11B illustrate devices in accordance with the second exemplary embodiment.
Figure 11B:
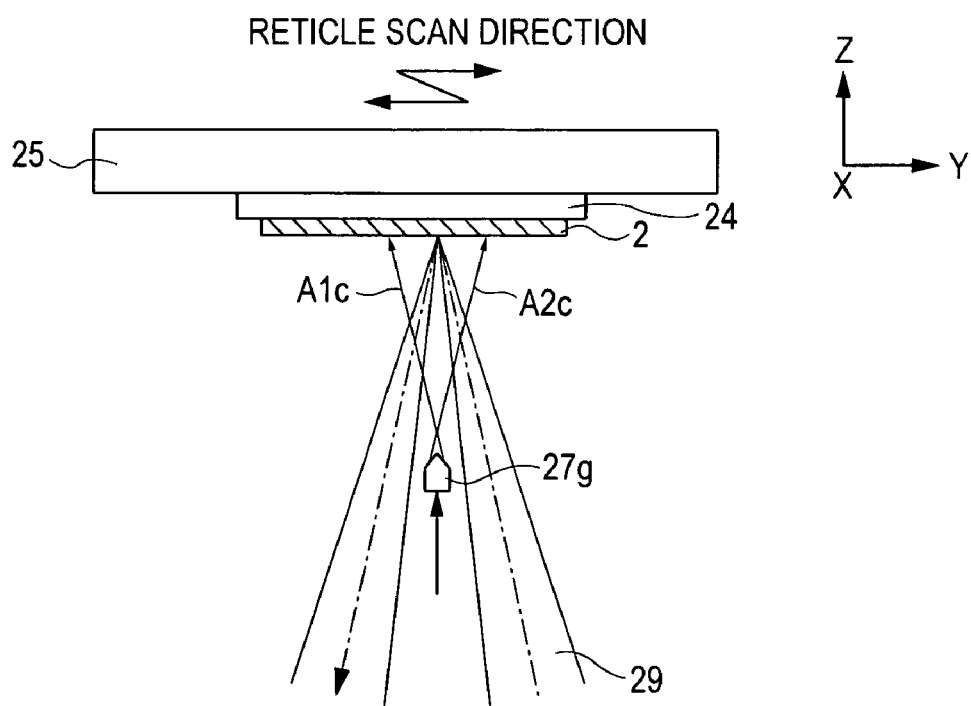

FIGS. 11A and 11B illustrate yet further examples in accordance with the second exemplary embodiment. FIG. 11B illustrates a configuration using one optical element 27f to one side of the exposure light to provide multiple beams A1b and A2b. FIG. 11B illustrates a configuration using a single optical element 27g bisecting the incident and reflected exposure light to provide multiple beams A1c and A2c.

Third Exemplary Embodiment

Figure 7:
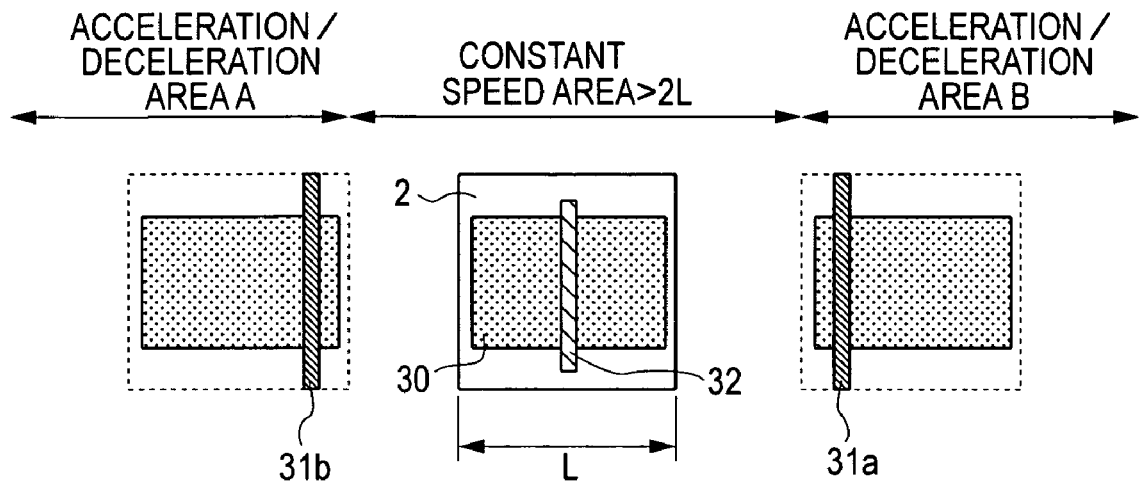
FIG. 7 illustrates the irradiation positions of the pulse laser beam in accordance with a third exemplary embodiment.

Next, a third exemplary embodiment will be described. In the above exemplary embodiments, the irradiation position of the pulse laser light is adjacent to that of the exposure light. In the present exemplary embodiment, as shown in FIG. 7, the reticle 2 is irradiated with the pulse laser light in the acceleration/deceleration areas. In order to move the reticle stage at a desired speed (constant speed) during exposure, there are acceleration/deceleration areas A and B before and after the constant speed area. As is clear from the description of the above exemplary embodiments, when a certain circuit pattern area is irradiated, it is effective to irradiate the area just before the exposure, that is to say, in the constant speed area. However, there is a relationship of formula (5) among the velocity of the stage (Vs), the pulse frequency (F), the number of irradiation pulses (N), and the thickness of the sheet beam (W), and therefore each parameter is limited. In order to achieve a desired removal rate, the velocity of the reticle stage can be reduced to increase the number of pulses. This arrangement can decrease the throughput. As a measure against this, the reticle is irradiated with the pulse laser in the acceleration/deceleration areas, that is to say, in the areas where the speed of the stage is low. This makes it possible to remove particles without reducing the throughput.

For example, when the reticle is irradiated in either the acceleration/deceleration area A or B, the pulse laser is shot at the position 31a or 31b. While the stage moves forward and backward, the reticle is scanned twice with the laser light. In the case where the pulse laser light is shot in both acceleration/deceleration areas A and B, the reticle is scanned four times. Either of them can be selected, depending on the removal rate of particles. Since the speed of the reticle stage in the acceleration/deceleration areas is lower than that in the constant speed area, more pulses can be shot. Thus, particles can be effectively removed without reducing the throughput.

Fourth Exemplary Embodiment

Next, a fourth exemplary embodiment will be described. In the above-described exemplary embodiments, the cross section of the removing pulse laser beam is elongated in a direction perpendicular to the scan direction. Through the utilization of scan operation of the reticle, the reticle can be entirely irradiated with the laser. In this case, the area irradiated with the laser is (the thickness of the sheet beam)×(the length of the sheet beam) (for example, a little less than 10 mm×150 mm). Depending on the components of the adhering particles, the irradiation energy density can be insufficient to achieve a desired removal rate. As described above, the adhesion force of the particles is mainly van der Waals force (Fv) in a normal vacuum environment. The order of this force can be estimated from the following formula:

$$Fv=(A*Dp)/(12*Z^2) \quad (6)$$

In this formula, Dp is a diameter of particles, and Z is a distance between the surface of particles and the surface to which particles adhere. Normally, Z is 0.4 to 0.5 nm. A is a Hamaker constant and it is different depending on the material of the particles. In the case of resin material, the adhesion force is approximately (4 to 10)×1E−20 J. In the case of metal material, the adhesion force is approximately (15 to 50)×1E−20 J. Therefore, the adhesion force is different depending on the component of the adhering particles. In order to remove particles having a large adhesion force, it is necessary to reduce the irradiation area to increase the irradiation energy density without damaging the reticle.

Figure 10:
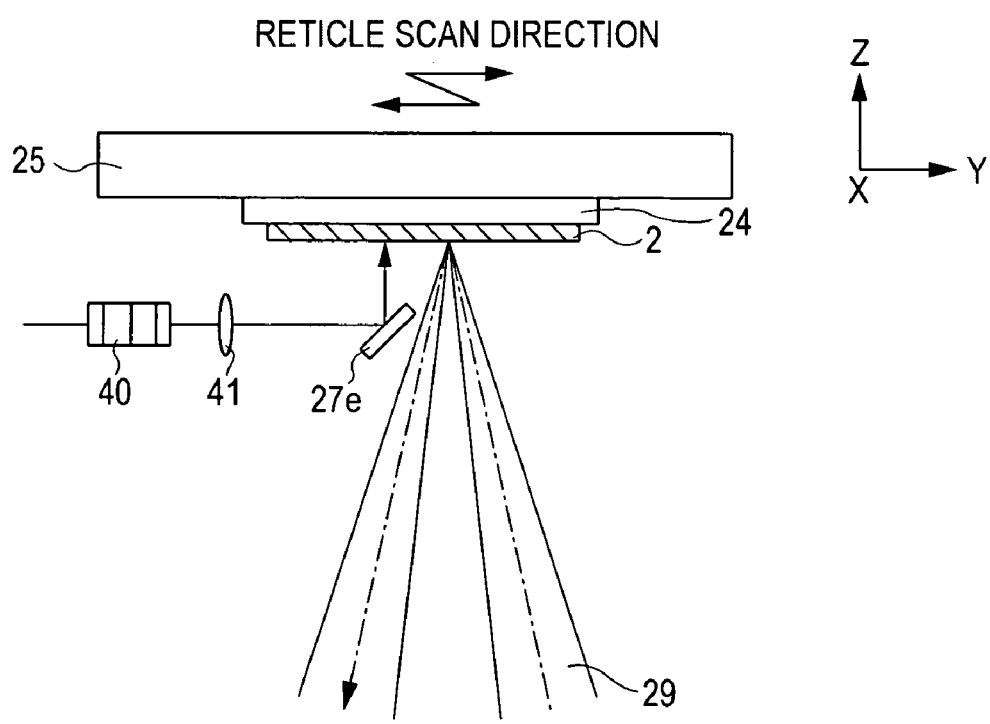
FIG. 10 illustrates a device in accordance with a fourth exemplary embodiment. The device can scan the reticle with the pulse laser beam in the X direction.
Figure 12:
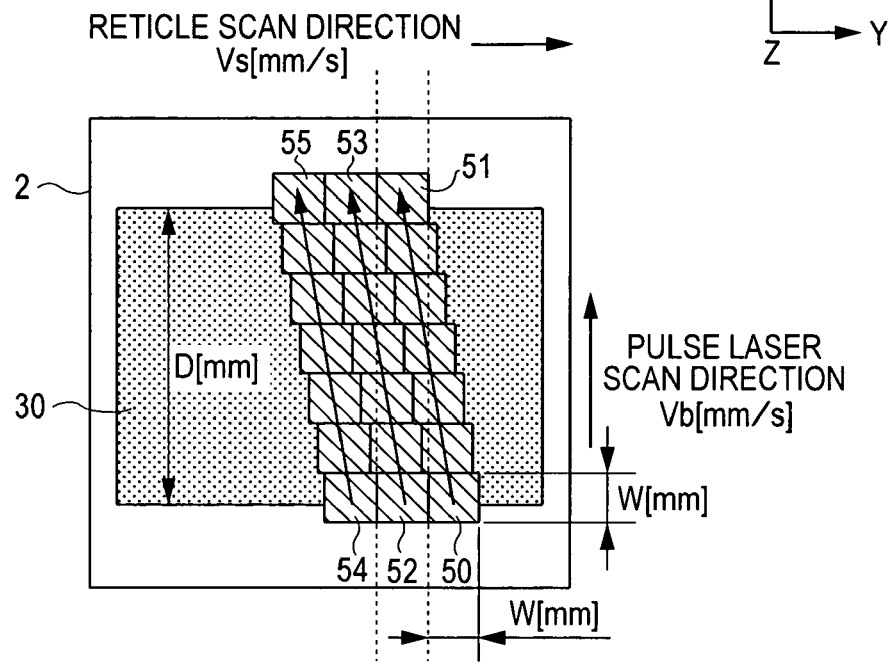
FIG. 12 illustrates how the reticle is scanned with the pulse laser beam in the fourth exemplary embodiment.

In consideration of this, in the present exemplary embodiment, the irradiation area is reduced. In order to irradiate the entire removal area with the pulse laser, it is necessary to move the beam in a direction (X direction) perpendicular to the direction in which the reticle moves (Y direction) as illustrated in FIG. 12. For this purpose, as shown in FIG. 10, the present embodiment has a polygon mirror 40 and an fθ lens 41. The polygon mirror 40 swings (deflects) the laser light. The fθ lens 41 collects the beam. In addition, the speed at which the reticle is scanned with the beam is made constant by the fθ lens 41. The beam deflected by the polygon mirror 40 is reflected upward by an optical element (e.g., mirror) 27e, and the removal area 30 (FIG. 12) is irradiated with the beam. FIG. 12 shows how the reticle 2 is scanned with the beam. Actually, the reticle is continuously scanned with the beam using the polygon mirror 40. However, in FIG. 12, the reticle 2 is discontinuously scanned for convenience of explanation. In the present exemplary embodiment, since the reticle 2 is scanned with the beam using the polygon mirror 40, the reticle 2 is scanned in only one direction. For example, the beam is moved from the position 50 in the direction of the arrow. As soon as the beam arrives at the position 51, the beam returns to the initial position. Since the reticle stage moves while the beam moves from the position 50 to the position 51, the beam returns to the position 52. The beam is moved in the direction of the arrow to the position 53. In this way, the laser light repeats oblique movements relative to the removal area 30 so as to cover the entire removal area 30.

As in the above embodiments, to facilitate an effective removal rate, parameters can satisfy the following condition. Here, a travel distance of the pulse laser in X direction is D [mm], a velocity at which the stage moves is Vs [mm/s], and a frequency of pulse is F [Hz]. In addition, the number of irradiation pulses is N [#], an irradiation area (an area of the cross section of the beam) is W [mm]×W [mm], and a frequency of beam scan is f [Hz].

In FIG. 12, when the scan velocity of the pulse laser is Vb, the time required for the beam to move in the laser scan direction by W (ΔTs) is obtained from the following formula:

$$\Delta Ts=W/Vb \quad (7)$$

When the distance that the pulse laser moves in the removal area 30 for each scan is D, the time required to move through the distance D is 1/f. The scan velocity of the pulse laser Vb is (D*f), and therefore $$\Delta Ts=W/Vb=W/(D*f) \quad (8)$$

When the removal area 30 needs to be irradiated with at least N pulses in ΔTs, the pulse interval ΔTp is obtained from the following formula:

$$\Delta Tp=\Delta Ts/N=W/(D*f*N) \quad (9)$$

On the other hand, the pulse interval of the pulse laser light source (Δτ) is obtained from the following formula:

$$\Delta\tau=1/F \quad (10)$$

If ΔTp is smaller than Δτ, the system does not work or a higher laser pulse frequency is needed. Therefore, $$W/(D*f*N)>1/F \quad (11)$$

$$\therefore (D*f*N)/W<F \quad (12)$$

There is a limit of formula (12) for the scan with the pulse laser in the X direction.

As described above, after one scan is completed, the next scan needs to be performed in an area adjoining or overlapping the already scanned area so as not to leave an unscanned area. That is to say, the time required for each scan in the X direction is 1/f, and the distance that the reticle stage moves in 1/f must be less than or equal to the size of the beam W. Therefore, $$W>Vs*(1/f)$$

$$\therefore W>Vs/f \quad (13)$$

There is a limit of formula (13) for the scan with the pulse laser in the Y direction. In the above explanation, the size of the irradiation area (spot) is W [mm]×W [mm]. However, the spot size in the direction perpendicular to the scan direction $W_1$ may be different from that in the scan direction $W_2$. In this case, W in formula (12) and W in formula (13) are replaced by $W_1$ and $W_2$, respectively.

As described above, in the present exemplary embodiment, to facilitate an effective removal rate, both formulas (11) and (13) can be satisfied. Even when the irradiation area is reduced in order to increase the energy density of the laser, particles can be removed by scanning in the above manner. In the present exemplary embodiment, the pulse laser light is swung (deflected) by the polygon mirror. However, the pulse laser light may be swung (deflected) by other optical elements in as similar manner as known by one of ordinary skill in the relevant arts and equivalents.

Fifth Exemplary Embodiment

Next, a fifth exemplary embodiment will be described. The method for removing particles by irradiating with a pulse laser according to present exemplary embodiment is not a method in which a detector detects a place to which particles adhere and then the place is irradiated with the pulse laser. In parallel with the exposure operation of the exposure apparatus, the entire surface in a predetermined area of the reticle is irradiated with the removing laser light. Normally, the reticle is mainly formed of a material with an ultra low thermal expansion coefficient (for example, 0.05E-6/K) such as ZERODUR®. However, irradiated with the laser for a long time, the temperature of the reticle increases. If the temperature rises by 1° C., the entire surface of the reticle thermally expands by about 7.5 nm. Depending on the irradiation energy, some measures are necessary.

Figure 13:
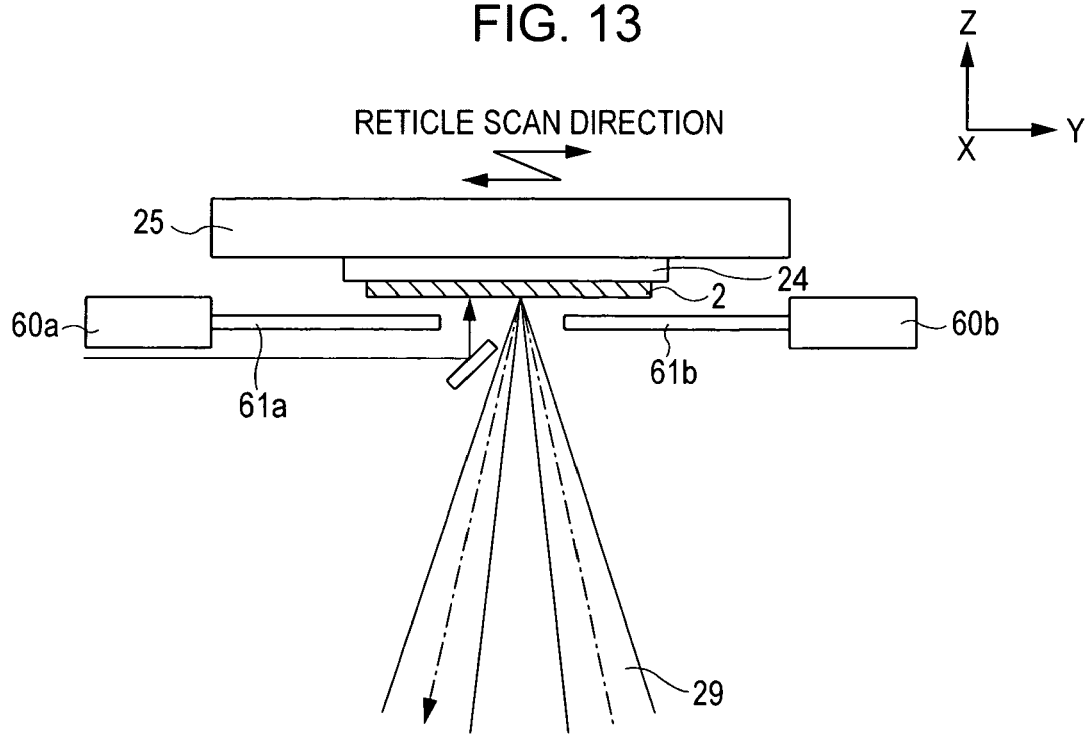
FIG. 13 illustrates cooling devices in accordance with a fifth exemplary embodiment.

FIG. 13 shows an example of configuration of the fifth exemplary embodiment. Unlike the above embodiments, the present exemplary embodiment has electronic cooling devices (e.g., Peltier elements) 60a and 60b and cooling plates 61a and 61b joined thereto. In the present exemplary embodiment, radiation cooling by the cooling plates is used as a method for cooling the reticle. It is more effective to make the cooling plates out of a material having high thermal conductivity and a high radiation ratio close to one. The cooling plates have a size covering the entire surface of the reticle and are disposed close to the reticle as shown in FIG. 13. The shape coefficient between the heat source and the cooling plates can be important in the radiation cooling method. The above size and location of the cooling plates can make the shape coefficient approximately one. Therefore, the energy applied by irradiation of the pulse laser can be efficiently retrieved. In the present exemplary embodiment, the cooling devices 60a and 60b and the cooling plates 61a and 61b can be used for cooling the reticle. However, the reticle may be cooled by other means, for example, a method in which cooling water flows in cooling plates. Any method will do as long as it can effectively cool the reticle.

Sixth Exemplary Embodiment

Figure 14:
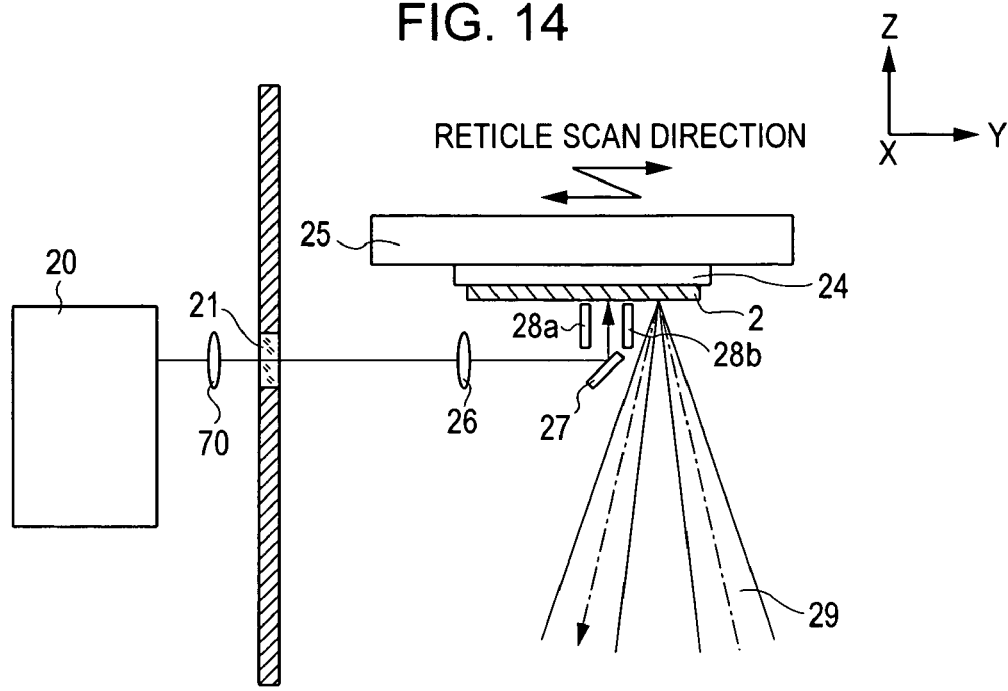
FIG. 14 illustrates a sixth exemplary embodiment including electrodes for catching the particles removed from the reticle.

Next, a sixth exemplary embodiment will be described. In the above-described exemplary embodiments, after removed by irradiation of the pulse laser, particles free-fall in the vacuum chamber and collide with and adhere to other members. There is a projection optical system below the reticle. Re-adhesion of the particles to the surfaces of optical members (elements) such as a reflection mirror decreases the reflectance and contaminates the surfaces. The present exemplary embodiment minimizes this contamination. As illustrated in FIG. 14, a pair of electrodes 28a and 28b are disposed close to the reticle. The pulse laser light passes between the electrodes 28a and 28b to be incident on the reticle 2. An electric field is formed between the electrodes 28a and 28b to catch the particles.

It is not clear whether the particles removed by the pulse laser are electrically-charged, and it is difficult to measure that. In general, particles generated by a relatively rapid reaction include a lot of charged particles, and particles generated by a mild reaction include few charged particles. Therefore, the particles removed by the laser light irradiation would presumably be charged to some extent. In general, nonmetal particles and nonmetal oxide particles charge positively, and metal particles and metal oxide particles charge negatively. Therefore, when the electrode 28a is positive and the electrode 28b is negative in the present embodiment, particles can be caught even if they have different polarity depending on their composition. Even if the particles are not charged, the particles can be caught with an electric field to some extent because, in the case of conductor particles, electrostatic induction generates an electric charge on the surfaces thereof, and in the case of non-conductor particles, induced polarization generates an electric charge on the surfaces thereof.

Seventh Exemplary Embodiment

Next, a seventh exemplary embodiment will be described. In the present exemplary embodiment, in order to effectively remove particles, the multilayer structure of the reticle includes a layer that is transmissive to the exposure light but absorbs the pulse laser light for removing particles. When the reticle is irradiated with the pulse laser light, a rapid (in the order of nanoseconds) temperature rise of particles and the surface to which the particles adhere causes thermal expansion, thereby removing the particles from the surface. When the force corresponding to the acceleration generated by this thermal expansion becomes larger than the adhesion force, the particles are removed. In general, the amount of light transmitted through a material (i.e. the Intensity I) obeys the following Beer's law:

$$I/I_0 = \exp(-\alpha * Z) \quad (14)$$

Here, $I_0$ is an intensity of incident light, $\alpha$ is an absorption coefficient of the material at the wavelength of the incident light, and Z is a thickness of the material. According to the formula (14), when an absorption coefficient $\alpha$ is large, $I/I_0$ is small. Therefore, the amount of light absorbed by the material is large, and the temperature of the material rises rapidly. On the other hand, when an absorption coefficient $\alpha$ is small, $I/I_0$ is large. Therefore, the amount of light absorbed by the material is small and the temperature of the material hardly rises.

Figure 15:
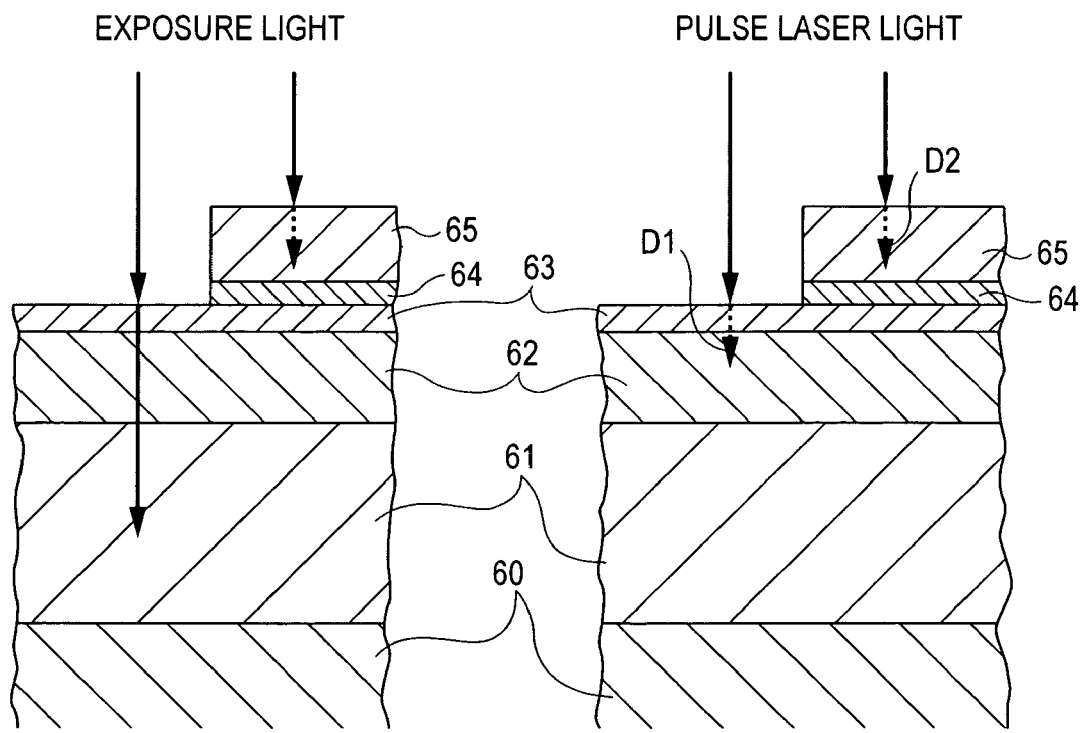
FIG. 15 illustrates a reticle in accordance with a seventh exemplary embodiment. The multiple layer of the reticle includes a thermal expansion layer for removing the particles.

As shown in FIG. 15, the multilayer structure of the reticle of the present exemplary embodiment includes a base material (e.g., of ZERODUR® 60), a multilayer (e.g., of Mo/Si) 61 thereon, and a thermal expansion layer 62 thereon. The thermal expansion layer 62 transmits the exposure light but absorbs the pulse laser light. For example, when the removing laser is a KrF laser, the material of the thermal expansion layer suitable for this purpose is, for example, silicon. When the thermal expansion layer is formed of silicon, the absorption coefficient $\alpha$ is 1.7/μm for a EUV exposure light and 166.7/μm for the KrF laser. Therefore, the thermal expansion layer can well absorb D1 the pulse laser light incident thereon. Reference numeral 63 denotes a cap layer for preventing oxidation. The cap layer 63 is formed of, for example, $SiO_2$. On the cap layer 63, an additional layer 64 is provided (e.g., ruthenium). The additional layer 64 serves as a buffer layer. On the ruthenium layer 64, a chromium layer 65 is provided. The chromium layer 65 serves as an absorbing layer for the EUV light. If particles adhere to the chromium layer 65, they can be effectively removed because chromium also absorbs D2 the KrF laser. In the present exemplary embodiment, several types of lasers can be used, for example a KrF laser (248 nm), as the pulse laser for removing particles. Therefore, the thermal expansion layer is formed of whatever material is absorptive to the laser sued (e.g., for KrF, silicon can be used, which is a material that absorbs the KrF laser). Any material that well absorbs the laser pulse will do. It goes without saying that the optimum material for the thermal expansion layer depends on the wavelength of the pulse laser for removing particles.

Applications

Figure 16:
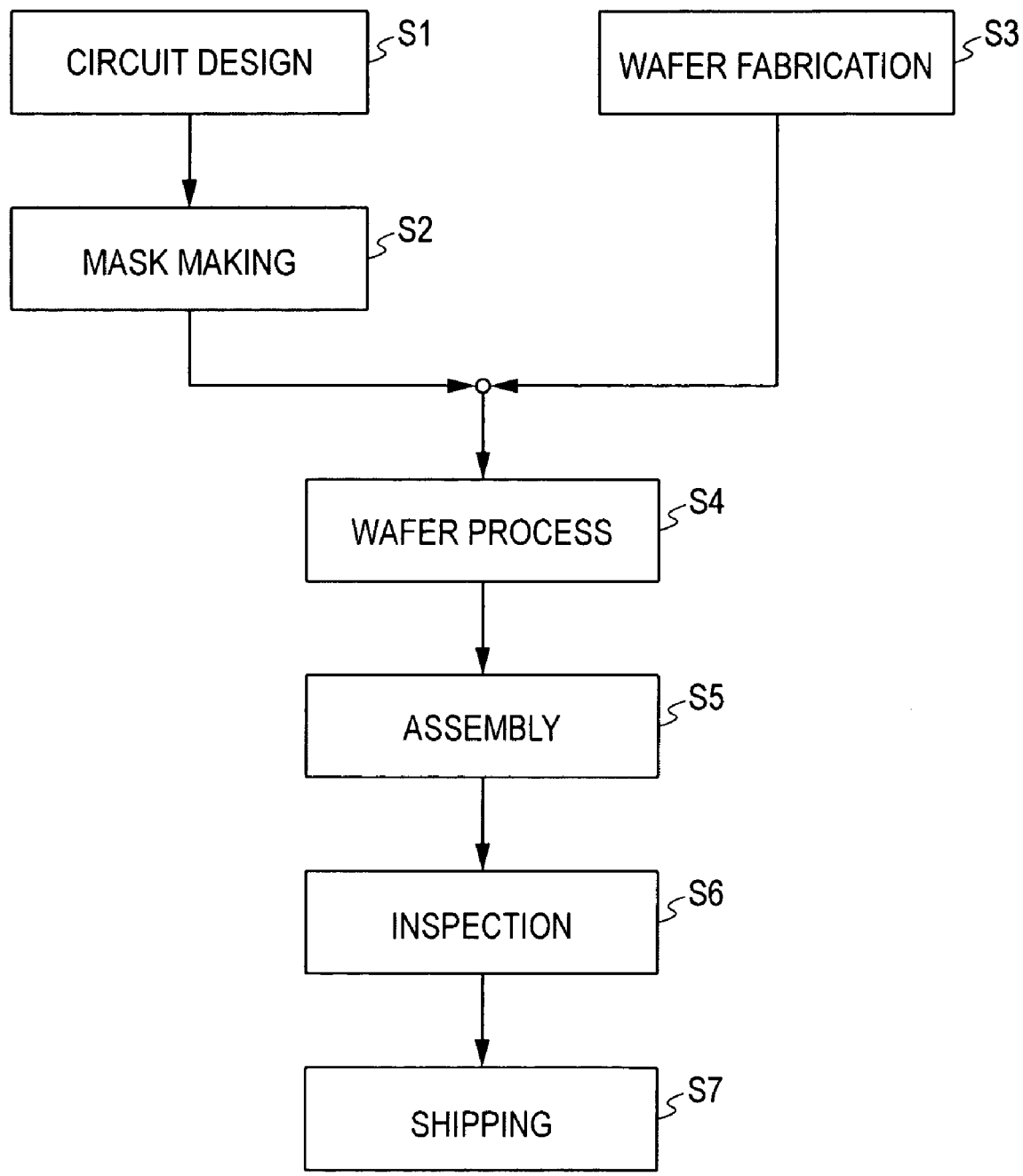
FIG. 16 illustrates the flow of the whole manufacturing process of semiconductor device.

Next, as an example of a method for manufacturing devices using the above exposure apparatus in accordance with exemplary embodiments, a process of manufacturing semiconductor devices will be described. FIG. 16 illustrates the flow of the whole manufacturing process of semiconductor devices. In step S1 (circuit design), a semiconductor device circuit is designed. In step S2 (mask making), a mask is made on the basis of the designed circuit pattern. In step S3 (wafer fabrication), wafers are fabricated using a material (e.g., silicon). Step S4 (wafer process) is called a front end process. In step S4, actual circuits are formed on the wafers by lithography using the mask and the above exposure apparatus. Step S5 (assembly) is called a back end process. In step S5, semiconductor chips are made of the wafers processed in step S4. The back end process includes an assembly process (dicing and bonding) and a packaging process (chip encapsulation). In step S6 (inspection), inspections such as an operation confirmation test and a durability test of the semiconductor devices made in step S5 are conducted. Through this process, the semiconductor devices are completed and shipped in step S7.

The wafer process of step S4 includes the following steps. An oxidation step in which the surface of a wafer is oxidized. A CVD step in which an insulating film is formed on the wafer surface. An electrode formation step in which electrodes are formed on the wafer by vapor deposition. An ion implantation step in which ions are implanted in the wafer. A resist process step in which a photosensitive material is applied to the wafer. An exposure step in which the circuit pattern is transferred to the wafer with the above exposure apparatus. A development step in which the exposed wafer is developed. An etching step in which the wafer is etched except for the developed resist image. A resist stripping step in which the resist is removed. These steps are repeated, and multilayer circuit patterns are formed on the wafer.

As described above, in the above exemplary embodiments, removal of particles on the reticle is carried out in parallel with a normal operating sequence of the exposure apparatus. Therefore, exposure can be carried out with the surface of the reticle always clean, without reducing the throughput.

In the first exemplary embodiment, a pulse laser beam can be shaped into a sheet shape, the width of the sheet-shaped beam can be approximately the same as the width of the reticle, and the width direction of the beam can be substantially perpendicular to the direction in which the reticle moves. Therefore, the entire surface of the reticle can be irradiated with the pulse laser beam.

In the second exemplary embodiment, two places are irradiated with the pulse laser, and a place between the two places is irradiated with the exposure light. Therefore, the particles can be removed just before the exposure, regardless of the direction in which the reticle moves.

In the third exemplary embodiment, irradiation of a pulse laser beam is carried out in acceleration/deceleration areas before and after the reticle stage moves at a constant speed. Since irradiation is carried out when the reticle stage moves at a low speed, it is possible to ensure the number of pulses that would facilitate removal of the particles.

In the fourth exemplary embodiment, a pulse laser beam is shaped into a spot shape, and the size of the spot-shaped beam is reduced to a size corresponding to an energy density necessary for removal of the particles. In addition, the spot is moved in the direction substantially perpendicular to the direction in which the reticle moves. Therefore, the entire surface of the reticle can be irradiated with a pulse laser beam having an energy density that facilitates removal of the particles.

In the fifth exemplary embodiment, radiation cooling devices are disposed close to the reticle. Therefore, the raising the temperature of the reticle from irradiation by the pulse laser beam for removing the particles is reduced.

In the sixth exemplary embodiment, a pair of electrodes are disposed close to the reticle, the pulse laser beam passes between the electrodes to be incident on the reticle, and an electric field is formed between the electrodes. Therefore, the particles removed from the reticle can be caught in the electric field.

In the seventh exemplary embodiment, the multilayer constituting the reticle includes a layer that has a high transmittance (a small absorption coefficient) to the exposure light but a low transmittance (a large absorption coefficient) to the pulse laser beam for removing particles. When the surface of the reticle is irradiated with the pulse laser beam, the rate of temperature rise is large and therefore the rate of thermal expansion is large. Therefore, the removal rate of the particles can be improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2004-299790 filed Oct. 14, 2004, which is hereby incorporated by reference herein in its entirety.

What is claimed is:

1. An apparatus comprising:

an original stage configured to hold an original and to move in a scan direction;

an illumination optical system configured to illuminate the original held by said original stage with exposure light;

a substrate stage configured to hold a substrate and to move in a scan direction;

a projection optical system configured to project a pattern of the original onto the substrate with the exposure light; and an irradiation unit configured to irradiate the original held by said original stage with light of which wavelength is different from wavelength of the exposure light, wherein said irradiation unit irradiates the original held by said original stage while the original is moved in the scan direction by said original stage so as to remove contaminant on the original, and wherein while said illumination optical system illuminates a first area on the original with the exposed light, said irradiation unit irradiates a second area on the original different from the first area.

2. An apparatus according to claim 1, wherein said irradiation unit comprises a light source, and an irradiation optical system for irradiating the original held by said original stage with light from said light source.

3. An apparatus comprising:
- an original stage configured to hold an original and to move in a scan direction;
- an illumination optical system configured to illuminate the original held by said original stage with exposure light;
- a substrate stage configured to hold a substrate and to move in a scan direction;
- a projection optical system configured to project a pattern of the original onto the substrate with the exposure light; and
- an irradiation unit configured to irradiate the original held by said original stage with light of which wavelength is different from wavelength of the exposure light,
- wherein said irradiation unit irradiates the original held by said original stage while the original is moved in the scan direction by said original stage so as to remove a contaminant on the original, and
- wherein while a position of an area to be exposed on the substrate held by said substrate stage is measured, said irradiation unit irradiates the original.

4. An apparatus according to claim 1, wherein said irradiation unit comprises a beam shaping element to shape a pulse laser light into a sheet-shaped beam, a direction of a width of the sheet-shaped beam is perpendicular to the scan direction of said original stage, the width of the sheet-shaped beam is not smaller than a dimension of a pattern of the original in the direction of the width, and a thickness of the sheet-shaped beam corresponds to an energy density necessary for removal of the contaminant.

5. An apparatus according to claim 4, wherein a moving velocity of said original stage (Vs), the thickness of the sheet-shaped beam (W), a pulse frequency of the pulse laser light (F), and a number of pulses of the pulse laser light necessary for removal of the contaminant (N) are set so as to satisfy the following relational expression:

$(Vs * N)/W < F$.

6. An apparatus comprising:
- an original stage configured to hold an original and to move in a scan direction;
- an illumination optical system configured to illuminate the original held by said original stage with exposure light;
- a substrate stage configured to hold a substrate and to move in a scan direction;
- a projection optical system configured to project a pattern of the original onto the substrate with the exposure light; and
- an irradiation unit configured to irradiate the original held by said original stage with light of which wavelength is different from wavelength of the exposure light,
- wherein said irradiation unit irradiates the original held by said original stage while the original is moved in the scan direction by said original stage so as to remove a contaminant on the original, and
- wherein said irradiation unit comprises a beam shaping element to shape a pulse laser light so that the pulse laser light forms a spot on the original held by said original stage, and a scanning element to scan the spot in a direction perpendicular to the scan direction of said original stage, and a dimension of the spot corresponds to an energy density necessary for removal of the contaminant.

7. An apparatus according to claim 6, wherein a moving velocity of said original stage (Vs), a dimension of the spot in a direction perpendicular to the scan direction (W1), a dimension of the spot in the scan direction (W2), a pulse frequency of the pulse laser light (F), a number of pulses of the pulse laser light necessary for removal of the contaminant (N), a distance which the spot travels in a scan by said scanning element (D), and a frequency of the scan of the spot by said scanning element (f) are set so as to satisfy the following relational expressions:

$(D * f * N)/W1 < F$ $W2 > Vs/f$.

8. An apparatus comprising:
- an original stage configured to hold an original and to move in a scan direction;
- an illumination optical system configured to illuminate the original held by said original stage with exposure light;
- a substrate stage configured to hold a substrate and to move in a scan direction;
- a projection optical system configured to project a pattern of the original onto the substrate with the exposure light; and
- an irradiation unit configured to irradiate the original held by said original stage with light of which wavelength is different from wavelength of the exposure light,
- wherein said irradiation unit irradiates the original held by said original stage while the original is moved in the scan direction by said original stage so as to remove a contaminant on the original, and
- wherein said irradiation unit irradiates the original in at least one of an acceleration region and a deceleration region of said original stage.

9. An apparatus according to claim 1, wherein said irradiation unit irradiates the original at two areas, and said illumination optical system illuminates the original at an area between the two areas.

10. An apparatus according to claim 1, further comprising a cooling member for cooling the original held by said original stage by radiation, said cooling member having an opening through which the exposure light passes.

11. An apparatus according to claim 1, further comprising an electric-field generating unit, said electric-field generating unit comprising two electrodes to generate an electric field therebetween, said irradiation unit irradiates the original with light passing between said two electrodes.

12. An apparatus according to claim 1, wherein the exposure light is extreme ultraviolet light.

13. A method of manufacturing a device, said method comprising:
- projecting a pattern of an original onto a substrate using an apparatus according to claim 1;
- developing the substrate onto which the pattern has been projected; and
- processing the developed substrate to manufacture the device.

14. A method, applied to an exposure apparatus, for removing a contaminant on an original, said apparatus comprising:
- an original stage configured to hold the original and to move in a scan direction;

an illumination optical system configured to illuminate a first area on the original held by the original stage with exposure light;
a substrate stage configured to hold a substrate and to move in a scan direction;
a projection optical system configured to project a pattern of the original onto the substrate with the exposure light;

said method comprising:

moving the original held by the original stage in a scan direction, irradiating a second area different from the first area on the original held by the original stage moving in the scan direction with light of which wavelength different from wavelength of from the exposure light so as to remove a contaminant on the original, while the illumination optical system illuminates the first area with the exposure light.

* * * * *